(12) United States Patent
Lewandowski et al.

(10) Patent No.: US 11,990,437 B2
(45) Date of Patent: May 21, 2024

(54) SYSTEM AND METHOD FOR FORMING SOLDER BUMPS

(71) Applicant: International Business Machines Corporation, Armonk, NY (US)

(72) Inventors: Eric Peter Lewandowski, White Plains, NY (US); Jae-Woong Nah, Closter, NJ (US); Jeng-Bang Yau, Yorktown Heights, NY (US); Peter Jerome Sorce, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 871 days.

(21) Appl. No.: 16/990,499

(22) Filed: Aug. 11, 2020

(65) Prior Publication Data

US 2021/0028138 A1 Jan. 28, 2021

Related U.S. Application Data

(62) Division of application No. 16/523,620, filed on Jul. 26, 2019, now Pat. No. 10,879,202.

(51) Int. Cl.
*G06N 5/04* (2023.01)
*G06F 7/38* (2006.01)
(Continued)

(52) U.S. Cl.
CPC ............ *H01L 24/11* (2013.01); *G06F 7/381* (2013.01); *G06N 10/00* (2019.01); *G06N 10/20* (2022.01);
(Continued)

(58) Field of Classification Search
CPC .... G06N 10/20; G06N 10/00; H10N 60/0912; H10N 60/805
See application file for complete search history.

(56) References Cited

U.S. PATENT DOCUMENTS

2013/0285185 A1* 10/2013 Park ................. H01L 27/14636
257/434
2017/0053886 A1 2/2017 Uzoh et al.
(Continued)

FOREIGN PATENT DOCUMENTS

JP H10173001 A 6/1998
JP H11312758 A 11/1999
(Continued)

OTHER PUBLICATIONS

International Searching Authority, PCT/EP2020/066803, dated Nov. 12, 2020.
(Continued)

*Primary Examiner* — Paul A Wartalowicz
(74) *Attorney, Agent, or Firm* — Garg Law Firm, PLLC; Rakesh Garg; Erik Johnson (57) ABSTRACT

In an embodiment, a method for forming a solder bump includes preparing a transfer mold having a solder pillar extending from a mold substrate and through a first photoresist layer and having a shape partially defined by a second photoresist layer that is removed prior to transfer of the solder. In an embodiment, the mold substrate is flexible. In an embodiment, the transfer mold is flexible. In an embodiment, the method includes providing a device substrate having a wettable pad. In an embodiment, the method includes placing the transfer mold and the device substrate into aligned contact such that the solder pillar is in contact with the wettable pad. In an embodiment, the method includes forming a metallic bond between the solder pillar and the wettable pad. In an embodiment, the method includes removing the mold substrate and first photoresist layer.

14 Claims, 7 Drawing Sheets

(51) Int. Cl.
*G06N 10/00* (2022.01)
*G06N 10/20* (2022.01)
*G11C 11/44* (2006.01)
*H01L 23/00* (2006.01)
*H10N 60/01* (2023.01)
*H10N 60/80* (2023.01)
*H01L 21/60* (2006.01)

(52) U.S. Cl.
CPC .............. *G11C 11/44* (2013.01); *H01L 24/12* (2013.01); *H01L 24/16* (2013.01); *H10N 60/0912* (2023.02); *H10N 60/805* (2023.02); *H01L 2021/60022* (2013.01); *H01L 2021/60045* (2013.01); *H01L 2021/60067* (2013.01); *H01L 2224/11622* (2013.01); *H01L 2224/16227* (2013.01)

(56) References Cited

U.S. PATENT DOCUMENTS

2020/0373351 A1* 11/2020 Roberts .................. G06N 10/00
2020/0401924 A1* 12/2020 Paik ....................... G06N 10/00

FOREIGN PATENT DOCUMENTS

| JP | 2001358160 | A | 12/2001 |
| JP | 2002500763 | A | 1/2002 |
| JP | 2006210937 | A | 8/2006 |
| JP | 4063892 | B2 | 3/2008 |
| JP | 2013520011 | A | 5/2013 |
| JP | 2021504935 | A | 2/2021 |
| WO | 2011102929 | A2 | 8/2011 |
| WO | 2019105716 | A1 | 6/2019 |

OTHER PUBLICATIONS

List of all IBM related dockets, 2020.
International Searching Authority, PCT/EP2020/066803, dated Sep. 21, 2020.
International Searching Authority, PCT/EP2020/066803, dated Aug. 3, 2020.
P201901750JP01, Application No. 2022-500766, Notice of Reasons for Refusal, dated Dec. 20, 2023.
P201901750JP01, Application No. 2022-500766, Notice of Reasons for Refusal, English Translation, dated Dec. 20, 2023.

* cited by examiner

SYSTEM AND METHOD FOR FORMING SOLDER BUMPS

BACKGROUND

The present invention relates generally to a semiconductor device, a fabrication method, and fabrication system for forming solder bumps.

Hereinafter, a "Q" or "q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits) to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor (IBM is a registered trademark of International Business Machines corporation in the United States and in other countries.)

A superconducting qubit may include a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a superconducting qubit, the Josephson junction—which has a small inductance—is electrically coupled in parallel with one or more capacitive devices forming a nonlinear resonator.

The information processed by qubits is emitted in the form of microwave energy in a range of microwave frequencies. The microwave emissions are captured, processed, and analyzed to decipher the quantum information encoded therein. For quantum computing of qubits to be reliable, quantum circuits, e.g., the qubits themselves, the readout circuitry associated with the qubits, and other types of superconducting quantum logic circuits, must not alter the energy states of the particles or the microwave emissions in any significant manner. This operational constraint on any circuit that operates with quantum information necessitates special considerations in fabricating semiconductor structures that are used in such a circuit.

SUMMARY

The illustrative embodiments provide a method of forming solder bumps. In an embodiment, the method includes preparing a transfer mold having a solder pillar extending from a mold substrate and through a first photoresist layer, the solder pillar having a shape that is partially defined by a second photoresist layer, wherein the preparing of the transfer mold includes removing at least a portion of the second photoresist layer. In an embodiment, the mold substrate is flexible and adds flexibility to the transfer mold. In an embodiment, the transfer mold is flexible and conforms to non-planar receiving surfaces while transferring solder thereto. In an embodiment, the method includes providing a device substrate having a wettable pad. In an embodiment, the method includes placing the transfer mold and the device substrate into aligned contact such that the solder pillar is in contact with the wettable pad. In an embodiment, the method includes forming a metallic bond between the solder pillar and the wettable pad. In an embodiment, the method includes removing the mold substrate and first photoresist layer.

In an embodiment, the method includes the first photoresist layer comprising a permanent photoresist material, and the second photoresist layer comprises a strippable photoresist material.

In an embodiment, the method includes forming a wetting layer over the mold substrate. In an embodiment, the method includes forming a seed layer over the mold substrate. In an embodiment, the method includes forming a non-wetting layer over the second photoresist layer.

In an embodiment, the mold substrate is flexible, and the preparing of the transfer mold includes forming the transfer mold to be a flexible transfer mold.

In an embodiment, the method includes the device substrate being an interposer, and the providing of the device substrate comprises forming a hole therethrough. In an embodiment, the method includes attaching the interposer to a qubit semiconductor device, wherein the qubit semiconductor device comprises a Josephson junction, and wherein the attaching of the interposer to the qubit semiconductor device includes aligning the hole through the interposer with the Josephson junction to provide a path for accessing the Josephson junction. In an embodiment, the method includes the solder pillar being one of a plurality of solder pillars that are formed around the hole between the qubit semiconductor device and the interposer for providing an amount of thermal isolation of the Josephson junction.

In an embodiment, the method includes the device substrate comprising an organic substrate, and forming a hole through the device substrate.

In an embodiment, the method includes the solder pillar being one of a plurality of solder pillars of the transfer mold, and the plurality of solder pillars including a first solder pillar having a first diameter and a second solder pillar having a second diameter, the first diameter being larger than the second diameter.

In an embodiment, the method includes the device substrate comprising a semiconductor substrate, and further comprises forming a deep recess in the semiconductor substrate. In an embodiment, the method includes the semiconductor substrate comprising a circuit component in the deep recess.

In an embodiment, the forming of the metallic bond includes a cold-welding process that forms the metallic bond between the solder pillar and the wettable pad.

In an embodiment, the forming of the metallic bond includes performing a reflow process that forms the metallic bond between the solder pillar and the wettable pad.

In an embodiment, the method includes patterning the first and second photoresist layers to define a recess that extends through the first and second photoresist layers, and using injection molded soldering (IMS) to fill the recess with solder to form the solder pillar.

In an embodiment, the method includes patterning the first and second photoresist layers to define a recess that extends through the first and second photoresist layers, and forming a seed layer, wherein at least a portion of the seed layer is provided in the recess, and using electroplating to fill the recess with solder and form the solder pillar.

An embodiment includes a method of fabricating a transfer mold for transferring solder to a substrate. In an embodiment, the method includes preparing a mold substrate having an upper surface. In an embodiment, the method includes forming a first photoresist layer formed of a permanent photoresist material over the upper surface of the mold substrate. In an embodiment, the method includes forming a second photoresist layer formed of a strippable photoresist material over the first photoresist layer. In an embodiment, the method includes patterning the first and second photoresist layers to form a recess that extends through the second photoresist layer and at least a portion of the first photoresist layer. In an embodiment, the method includes forming a solder pillar in the recess. In an embodiment, the method includes removing the second photoresist layer after the solder pillar is formed, leaving a portion of the solder pillar extending above the first photoresist layer.

In an embodiment, the mold substrate is a flexible substrate. In an embodiment, the method includes forming a seed layer over the mold substrate, wherein the forming of the solder pillar includes using electroplating to form the solder pillar.

In an embodiment, the method includes using injection molded soldering (IMS) to form the solder pillar.

An embodiment includes a transfer mold apparatus for transferring solder to a substrate. In an embodiment, the apparatus includes a mold substrate, a first photoresist layer formed of a permanent photoresist material over at least a portion of the mold substrate, and a solder pillar extending above the mold substrate through a gap in the first photoresist layer. In an embodiment, the solder pillar includes an extrusion that extends above the first photoresist layer. In an embodiment, the extrusion has a shape that is partially defined by a second photoresist layer formed of a strippable photoresist material over the first photoresist layer. In an embodiment, the second photoresist layer is substantially absent at at least a portion of a surface of the first photoresist layer to define an open region surrounding the extrusion.

An embodiment includes a superconducting quantum processor, comprising a superconducting chip comprising a qubit; an interposer connected to the superconducting chip, the interposer defining a hole aligned with the qubit on the superconducting chip; and a plurality of solder interconnections forming a circular wall around the qubits and between the interposer and superconducting chip.

In an embodiment, the circular wall includes at least one gap therethrough.

In an embodiment, the gap is at least 10 μm wide.

In an embodiment, the solder interconnections are connected to the superconducting chip and to the interposer by respective metallic bonds.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

The illustrative embodiments used to describe the invention generally address and solve the problem of incorporating qubits in a greater variety of semiconductor or superconductor packages (compactly referred to hereinafter as package or packages unless expressly distinguished where used). Qubits have been successfully incorporated into wire bonded packaging, where a qubit chip is wire-bonded onto a substrate with the Josephson junction facing away from the substrate. It would be desirable to incorporate qubits into other types of packages, for example flip chip packages that allow for larger numbers of qubits in a given chip area and that can avoid cross talk issues. However, the inability to access the Josephson junction after the package is fabricated has prevented the use of qubits into other types of packages.

It would be desirable, for example, to have access to the Josephson junction to make adjustments to its design frequency. However, some types of packages have not allowed for adjustment of the design frequency because there is no line-of-sight access available for applying the heat or a reactive species to the Josephson junction. For example, a flip-chip package includes a semiconductor or superconductor device disposed face-down on a silicon interposer, so a Josephson junction would face the interposer. The interposer therefore blocks access to the Josephson junction, thereby preventing thermal or chemical processes on the Josephson junction. This is problematic because it is desirable to be able to adjust the design frequency of the qubit after fabrication because the ideal frequency is unknown until after the device is assembled and cooled down.

The illustrative embodiments used to describe the invention generally address and solve the above-described problem of adjusting a design frequency of a qubit in a flip chip semiconductor package by using a solder transfer method that allows for through holes in a substrate that would otherwise prevent the use of traditional patterning techniques.

An embodiment provides a method for forming solder bumps on a substrate. In an embodiment, the method includes preparing a transfer mold, which is used during a fabrication process. In an embodiment, the transfer mold is used for transferring a structure onto a component of a package being fabricated. In an embodiment, the transfer mold has a solder pillar extending from a mold substrate and through a first photoresist layer, the solder pillar having a shape that is partially defined by a second photoresist layer, wherein the preparing of the transfer mold includes removing at least a portion of the second photoresist layer. In an embodiment, the method includes preparing a device substrate having a wettable pad. In an embodiment, the wettable pad is pad that encourages the spreading of liquid solder thereon or the forming of a metallic bond therewith. In an embodiment, the method includes placing the transfer mold and the device substrate into aligned contact such that the solder pillar is in contact with the wettable pad. In an embodiment, the method includes performing a welding process that forms a metallic bond between the solder pillar and the wettable pad. In an embodiment, the method includes removing the mold substrate and first photoresist layer.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refers to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, the illustrative embodiments are described with respect to specific actual or hypothetical components only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIGS. 1A-1J, these figures show schematic, cross-sectional diagrams showing an exemplary method for forming solder bumps in accordance with an illustrative embodiment. For example, in a particular embodiment, a transfer mold 100 is formed according to processes shown in FIGS. 1A-1F, and the transfer mold 100 is then used for forming solder bumps on an interposer 114 shown in FIG. 1G according to fabrication processes shown in FIGS. 1H and 1J.

With reference to FIG. 1A, in a particular embodiment, a substrate 102 is prepared for assembly. In an embodiment, the preparation of the substrate 102 includes one or more processes for improving the adhesion of the forthcoming photoresist material to the substrate 102. For example, in an embodiment, the substrate 102 is prepared in such a way that includes at least one of (1) cleaning to remove contamination, (2) dehydration baking to remove moisture, and (3) adding an adhesion promoter to the substrate. In an embodiment, the substrate 102 is a substrate formed of any suitable material. For example, in an embodiment, the substrate 102 includes a flexible or rigid material that is stable at molten solder temperatures and stable with respect to stripping solvent used for removing photoresist material. For example, in an embodiment, the substrate 102 is rigid and is formed of one or more of the following non-limiting example materials: (1) a silicon wafer, (2) a glass plate, (3) a ceramic plate, or (4) a metal plate.

As another example, the substrate 102 is a non-rigid or flexible substrate formed of one or more of the following non-limiting example materials: (1) Polyimide film (such as Kapton), (2) polyethylene terephthalate (PET), (3) polyethylene naphthalate (PEN), (4) Polyether ether ketone (PEEK), (5) polyethylene (PE), (6) polyvinyl chloride (PVC), and (7) thin flexible metal or glass. In an embodiment, the substrate 102 is a flexible substrate having a relatively low Young's modulus of elasticity. For example, in an embodiment, the substrate 102 is a flexible substrate having a Young's modulus that is in a range of 60 kPa to 3 MPa. In an embodiment, the substrate 102 comprises a wafer-size substrate, round or otherwise. In an embodiment, the substrate 102 is be formed from a base substrate with a solder resist (SR) surface.

With reference to FIG. 1B, in a particular embodiment, a first photoresist layer 104 is formed and patterned over substrate 102 using any known photolithography process that is suitable. For example, in an embodiment, the first photoresist layer 104 includes one or more sublayers of a dry film resist lamination applied according to known techniques. As another example, in an embodiment, the first photoresist layer 104 is formed by one or more applications of a coating material, including spin coating each application of coating material to form one or more thin, uniform sublayers that collectively form the first photoresist layer 104 having a specific, predetermined thickness. In an embodiment, the first photoresist layer 104 is patterned to selectively remove portions of the photoresist material, thereby forming recesses 106. In an embodiment, recesses 106 extend to the substrate 102. In an embodiment, the first photoresist layer 104 is composed of a photoresist material that is relatively difficult to remove. For example, in an embodiment, the first photoresist layer 104 is composed of photo-patternable resist that is stable at molten solder temperatures and stable with respect to strippable solvent, such as a highly crosslinked epoxy.

In an embodiment, the first photoresist layer 104 is formed of one or more sublayers of the following non-limiting example materials: (1) a dry film negative photoresist that is water-repellent and can form layers having a thickness in a range of 5 µm to 100 µm, for example Engineered Materials Systems (EMS) DF-1000 series, such as EMS DF-1050, (2) a dry film negative photopolymer that forms layers having a thickness in a range of 5 µm to 100 µm, for example DuPont Vacrel Solder Mask films, and (3) an epoxy-based negative photoresist that can be spun or spread as a viscous polymer that forms layers having a thickness in a range of 1 µm to 300 µm, for example SU-8 epoxy-based resist. For example, in one embodiment, the first photoresist layer 104 is formed by laminating and patterning 5 to 10 sublayers of EMS DF-1050 (or one of the other related EMS photoresists having an alternative thickness and/or resolution), each sublayer film having a thickness in a range of 5 µm to 100 µm, to form layer 104 having a thickness in a range of 25 µm to 1000 µm. As another example, in one embodiment, a DuPont Vacrel Solder Mask film is used for the first photoresist layer 104 along with an optional solvent-barrier or adhesion layer 414 shown in FIG. 4 between the first and second photoresist layers to protect the solder mask film from being affected by the primary resist strip chemicals. In an embodiment, the upper surface of the first photoresist layer 104 is planar and a uniform height from the upper surface of the substrate 102.

With reference to FIGS. 1C-1D, in a particular embodiment, a second photoresist layer 108 is formed and patterned over the first photoresist layer 104 according to the same patterning used to pattern the first photoresist layer 104 using any known photolithography process that is suitable. For example, in an embodiment, the second photoresist layer 108 includes one or more layers of a dry film resist lamination applied according to known techniques. As another example, in an embodiment, the second photoresist layer 108 is formed by one or more applications of a coating material, including spin coating each application of coating material to form one or more thin, uniform sublayers that collectively form the second photoresist layer 108 having a specific, predetermined thickness. In an embodiment, the second photoresist layer 108 is patterned to selectively remove portions of the photoresist material, thereby forming recesses 110. In an embodiment, recesses 110 extend to the substrate 102. In an embodiment, the second photoresist layer 108 is composed of a photoresist material that is relatively easy to remove. For example, in an embodiment, the second photoresist layer 108 is composed of a strippable photo-patternable resist that is stable at molten solder temperatures but is also easily strippable with solvent.

In an embodiment, the second photoresist layer 108 is formed of one or more sublayers of the following non-limiting example materials: a dry film negative photoresist, for example (1) DuPont WBR series, WBR2050, WBR2100, WBR2150 (50, 100 and 150 µm thick), (2) Hitachi RY5325 and RY5345 (25 and 45 µm thick), (3) Asahi Dry Film (Sunfort), and (4) DuPont Riston series materials. For example, in one embodiment, the second photoresist layer 108 is formed by laminating and patterning 5 to 10 sublayers of WBR series dry film resist, each sublayer film having a thickness in a range of 50 µm to 100 µm, to form layer 104 having a thickness in a range of 250 µm to 1000 µm. In an embodiment, the upper surface of the second photoresist layer 104 is planar and a uniform height from the upper surface of the substrate 102.

In an embodiment, the upper surface of the second photoresist layer 108 is planar and a uniform height from the upper surface of the substrate 102. In an embodiment, the recesses 110 are cylindrical in shape. In another embodiment, the recesses 110 are frustoconical in shape with the internal diameter of the recesses 110 being relatively larger at the upper surface of the second photoresist layer 108 and relatively smaller at the bottom of the recess 110 at the upper surface of the substrate 102. The relatively wide openings at the tops of the recesses 110 facilitates separation after solder injection as described below.

With reference to FIG. 1E, in a particular embodiment, the recesses 110 are filled using injection molded soldering (IMS), where a fill head 116 traverses the substrate 102 and injects molten solder into the recesses 110 to form pillars 112. In an embodiment, the recesses 110 are filled completely to the tops, thereby ensuring uniformity of height of the resulting solder bumps without leaving a solder residue on the mask, and the pillars 112 are allowed to solidify, conforming to the shape of the recesses 110. In an embodiment, no solder flux is employed in the recesses 110. In an embodiment, the pillars 112 are electrically conductive and have relatively high melting points, though preferably below 285° C. or other temperature that is not compatible with the substrate 102. For example, non-limiting examples of materials used as solder to form the pillars 112 are lead-free solder using tin, indium, a tin alloy, or an indium alloy that contains Ag, Cu, Zn, Bi, In, Sb, Ni, Co, Ge and/or Fe. having relatively high melting points, indicated in parentheses, include Sn-20Au (280° C.), Sn-5Sb (243° C.), pure Sn (232° C.), Sn-0.7Cu (227° C.), Sn-3.5Ag (221° C.) and Sn-3.8AG-1.0Cu (217° C.).

In one embodiment, the material used for pillars 112 is deposited to a height greater than the combined thicknesses of first and second photoresist layers 104 and 108, and a backgrinding, etching, or other planarization process is performed so that a top surface of pillars 112 and an upper surface of the second photoresist layer 108 are coplanar as illustrated in FIG. 1E. In another embodiment, conductive pillars 112 are 3-D metal posts formed by copper plating or copper stud bumps.

With reference to FIG. 1F, the reason for the two different photoresist layers 104 and 108 is illustrated by the presence of the first photoresist layer 104 and the absence of the second photoresist layer 108. In an embodiment, a stripping process for removing photoresist layers such as those described above for the second photoresist layer 108, is performed according to known methods. For example, in an embodiment, the second photoresist layer 108 is removed using a resist remover for suitable for wafer level packaging (WLP) that is an aqueous organic mixture formulated to effectively remove thick photoresist used in wafer bumping and WLP, such as DuPont™ EKC162™ resist remover. Since the first photoresist layer 104 is formed of a photoresist material that is stable with respect to such a resist remove, the first photoresist layer 104 remains while the remaining portions of the second photoresist layer 108 are stripped away leaving the conductive pillars 112. In an embodiment, an extrusion of the pillar 112 remains above the first photoresist layer 104 after the second photoresist layer 108 is removed. The structure that remains is shown in FIG. 1F and is an example of an embodiment of a transfer mold 100 for forming solder bumps 122 on an interposer 114.

With reference to FIG. 1G and FIG. 2, FIG. 1G depicts a sectional view of an interposer 114 and FIG. 2 shows a plan view of the interposer 114 in accordance with an illustrative embodiment. In a particular embodiment, the interposer 114 is formed of a wafer or substrate formed of a suitable semiconductor substrate material. For example, in an embodiment, the interposer 114 is formed of one or more of the following non-limiting example materials: (1) silicon, (2) glass, and (3) organic substrate material. In an embodiment, the interposer 114 includes conductive structures that provide high density interconnects between the upper and lower surfaces of the interposer 114. For example, in an embodiment, the interposer 114 includes a plurality of through-silicon vias (TSVs) connecting metallization layers on its upper and lower surfaces.

In an embodiment, the interposer 114 defines a plurality of through holes 118 selectively positioned to align with qubits on a semiconductor device that will be connected to the interposer 114 in a flip-chip manner as discussed below and shown in FIG. 3. For example, in an embodiment, the through holes 118 have an inside diameter in a range of 50 μm to 500 μm. In an embodiment, the interposer 114 also includes a plurality of wettable pads 120. For example, in an embodiment, the interposer 114 includes under bump metallurgy (UBM) pads 120. For example, in an embodiment, the UBM pads 120 can be arranged and constructed according to know techniques to allow for alignment with and connection to the pillars 112 of the transfer mold 100. In an embodiment, the various through holes are formed by etched photolithographic processes or laser drilling.

With reference to FIG. 1H, this figure shows the result of mounting the interposer 114 onto the transfer mold 100 in accordance with an illustrative embodiment. In a particular embodiment, the interposer 114 is aligned over the transfer mold 100 and a welding process is performed that forms metallic bonds between the interposer UBM pads 120 respective mold pillars 112.

The term "metallic bond," as used herein, generally refers to a metallurgical bond between bonded metal articles in which the bonded metal articles are held together by the same attraction that exists between adjacent electrons of a metal and in which valence electrons of the bonded metal articles are free to move between the bonded metal articles. Examples of metallic bonds include, without limitation, bonds produced by soldering at the filler-metal/base-metal interface where the solder reacts with a small amount of the base metal and wets the metal by forming intermetallic compounds, and upon solidification, the solder joint is a metallic bond between the solder and the base metal that is more than adhesion or mechanical attachment.

The term "welding process," as used herein, unless otherwise indicated generally refers to any process for joining metals that results in a metallic bond. Examples of welding processes include, without limitation, bonds produced by soldering at the filler-metal/base-metal interface where the solder reacts with a small amount of the base metal and wets the metal by forming intermetallic compounds, and upon solidification, the solder joint is a metallic bond between the solder and the base metal that is more than adhesion or mechanical attachment.

In one embodiment, pillars 112 are attached to respective UBM pads 120 using a reflow process of heating the pillars 112 until they begin to melt while in contact with UBM pads 120, and then allowing them to cool and re-solidify. This process results in a solder joint between the pillars 112 and respective UBM pads 120. In another embodiment, the metallic bonds between the pillars 112 and UBM pads 120 are formed by cold welding processes that bond certain metals at temperatures below reflow temperature, such as room-temperature diffusion or diffusion at temperatures between room temperature and reflow temperature. For example, in an embodiment, the metallic bonds between the pillars 112 and UBM pads 120 are formed by cold welding processes that include applying pressure at room temperature or with some amount of heat being applied.

With reference to FIG. 1J, this figure depicts the interposer 114 with the through holes 118 and solder bumps 122 after removal of the substrate 102 and first photoresist layer 104. In a particular embodiment, the substrate 102 and first photoresist layer 104 can be lifted away from the interposer 114 and leave the pillars 112 attached to the interposer 114 because the metallic bond between the solder in the pillars 112 and the UBM pads 120 is much stronger than the secondary types of forces that were holding the pillars 112 to the substrate 102, such as dispersion or Van Der Waals types of forces.

Figure 1:
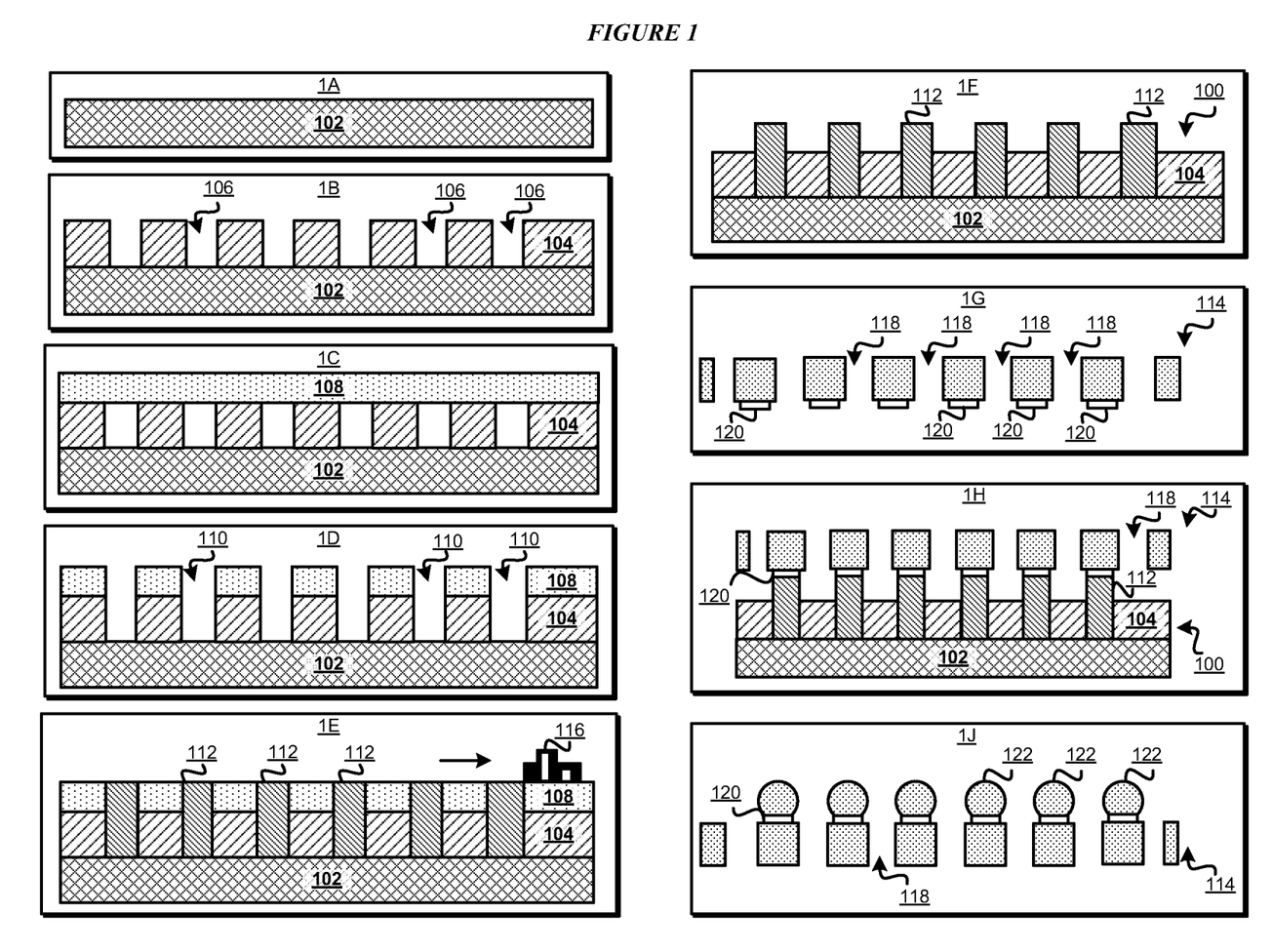
FIG. 1 depicts schematic, cross-sectional diagrams 1A, 1B, 1C, 1D, 1E, 1F, 1G, 1H, 1I, and 1J showing an exemplary method for forming solder bumps in accordance with an illustrative embodiment.
Figure 2A:
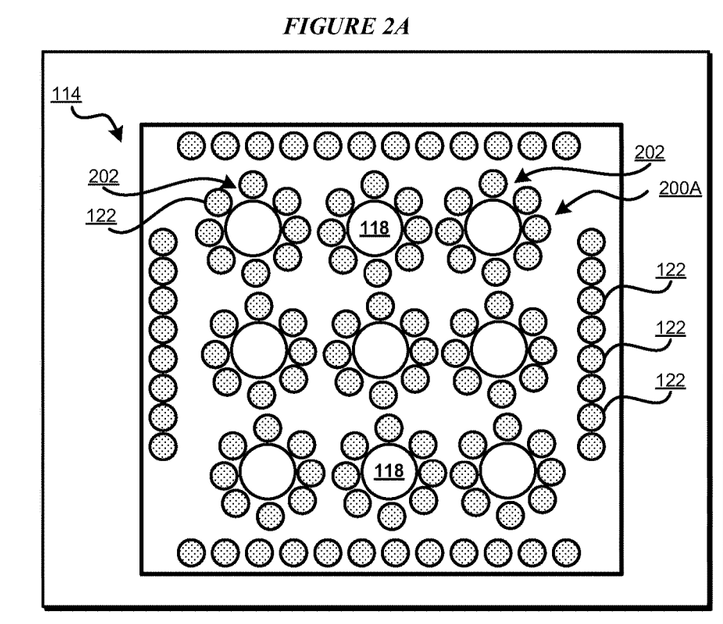
FIG. 2A depicts a plan views of interposers in accordance with illustrative embodiments.
Figure 2B:
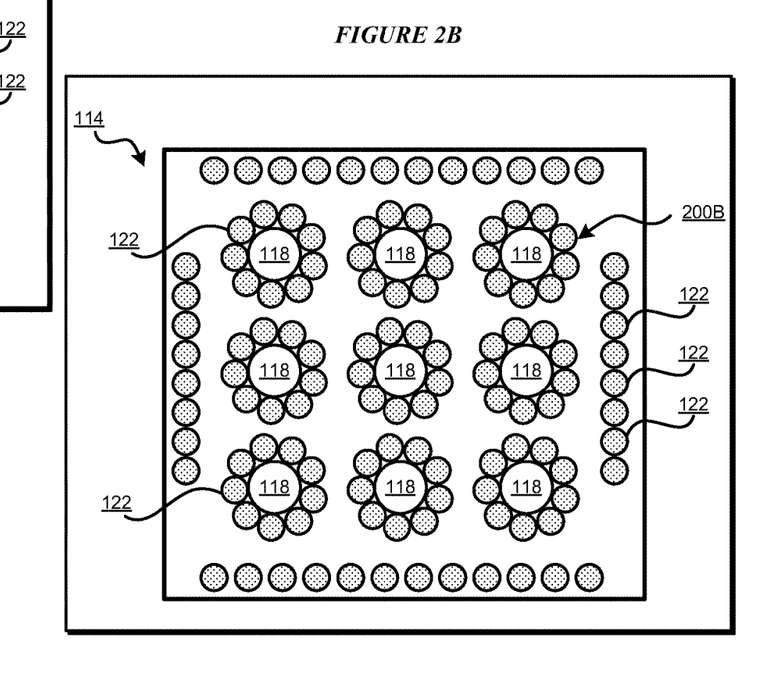
FIG. 2B depicts a plan views of interposers in accordance with illustrative embodiments.

With reference to FIGS. 2A and 2B, these figures depict plan views of embodiments of the interposer 114 shown in FIG. 1J with the solder bumps 122 formed thereon. In an illustrative embodiment shown in FIG. 2A, a configuration 200a includes a plurality of solder bumps 122 separated by gaps 202 are formed around a through hole 118. In an illustrative embodiment shown in FIG. 2B, a configuration 200b includes a plurality of solder bumps 122 that are each in contact with neighboring bumps 122 and are formed around a through hole 118. The solder bumps 122 in configurations 200a and 200b collectively improve the thermal isolation of a Josephson junction 304 (shown in FIG. 3) during a thermal or chemical operation described below, thereby helping to prevent the heat from the annealing operation from affecting or damaging other components.

In an embodiment, the configuration 200a of the solder bumps 122 are arranged to surround the through hole 118 without making physical contact with each other so gaps 202 are present between neighboring solder bumps 122. For example, in an embodiment of the configuration 200a, the solder bumps 122 formed around the through hole 118 block at least half of a cylindrical region aligned with the through hole 118 and extending between the interposer 114 and a substrate 302 mounted thereon. In an embodiment, the configuration 200b of the solder bumps 122 are arranged to surround the through hole 118 without gaps 202. However, while such an embodiment provides good thermal isolation, if the solder bumps 122 form a continuous ring, it is difficult to access the qubits, e.g., via busses. Thus, it is preferable to form a nearly continuous ring leaving at least one or more gaps 202 as small as 10 μm for example in a range of 10 μm to 20 μm, which are small enough to minimize thermal and mass transfer. In an embodiment, the number of gaps 202 depends on the qubit connectivity (e.g., the number of readout resonators plus the number of qubit to qubit busses). In an embodiment, a continuous or nearly continuous ring of solder bumps 122 is formed by photolithography, and IMS or electroplating one or more ring segments of any shape. In another embodiment, a continuous or nearly continuous ring of solder bumps 122 is formed by transferring spherical bumps 122 to a substrate with a patterned wettable segmented ring, then performing a second reflow after removing the transfer mold will cause the solder to wet segmented ring. In yet another embodiment, a continuous or nearly continuous ring of solder bumps 122 is formed by patterning bumps inside the segmented ring perimeter with a tight pitch, such that while the interposer is being attached to the superconducting chip 300 (or other substrate) the bumps 122 merge according to an amount of pressure and heat being applied (e.g., higher pressure during the join creates shorter wider bumps making physical contact with each other).

Figure 3:
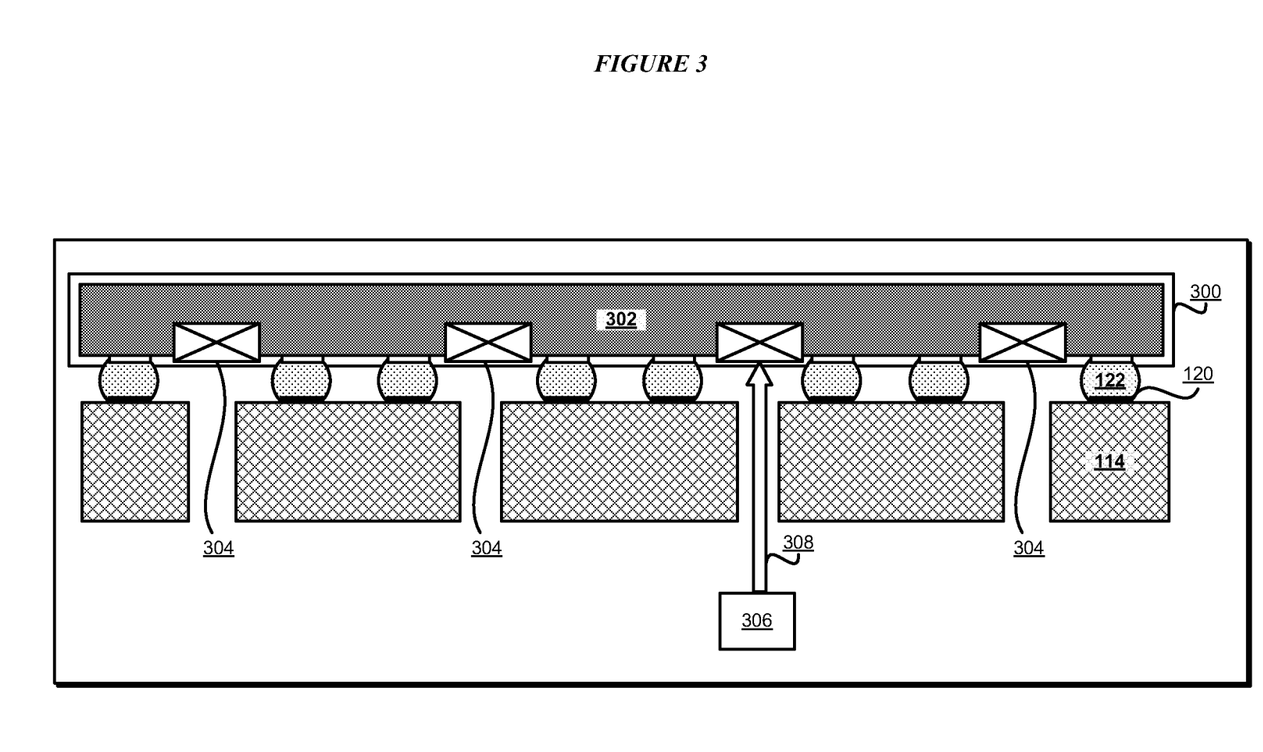
FIG. 3 depicts a cross-sectional view of a semiconductor package in accordance with an illustrative embodiment.

With reference to FIG. 3, this figure depicts a cross-sectional view of an example semiconductor package in accordance with an illustrative embodiment. In a particular embodiment, the semiconductor package is a flip-chip package that includes a superconducting chip 300 disposed face-down on the silicon interposer 114. The superconducting chip 300 includes a substrate 302 having a plurality of qubit Josephson junctions 304. In an embodiment, the Josephson junctions 304 are aligned with through holes 118 defined by the interposer 114. In an embodiment, the through holes 118 provide a line-of-sight path 308 to allow for direct heat, electromagnetic (EM) radiation, or reactive chemical species to pass through the interposer 114 so that the junction modification system 306 can direct such heat, radiation, or chemical species onto the Josephson junction 304 to tune the frequency of the qubit. In an embodiment, the path 308 has an outside diameter in a range of 10 μm to 20 μm. For example, in an embodiment, the path 308 has an outside diameter of about 15 μm.

In an embodiment, the substrate 302 on which the qubit circuits are formed is high resistivity (intrinsic) silicon wafers. In another embodiment, the Josephson junctions 304 are fabricated on the silicon (Si) substrate 302 using aluminum as a starting compound to form an Al/AlOx/Al structure. For example, in an embodiment, the substrate 302 is selected to reduce dielectric loss tangent at low temperatures. For example, in an embodiment, the substrate 302 is selected to be a material that is etched selectively to superconducting and dielectric material to be used for the Josephson junction 304. For example, in an embodiment, the substrate 302 is a high resistivity Si wafer may be implemented.

In an embodiment, the Josephson junctions 304 are adjusted in order to adjust the frequency of the qubits. In an embodiment, adjusting of the Josephson junction 304 includes heating, radiating, or applying a chemical species to the Josephson junction 304 to allow for a physical change to occur within the Josephson junction 304 that results in a change in the resistance.

Figure 4:
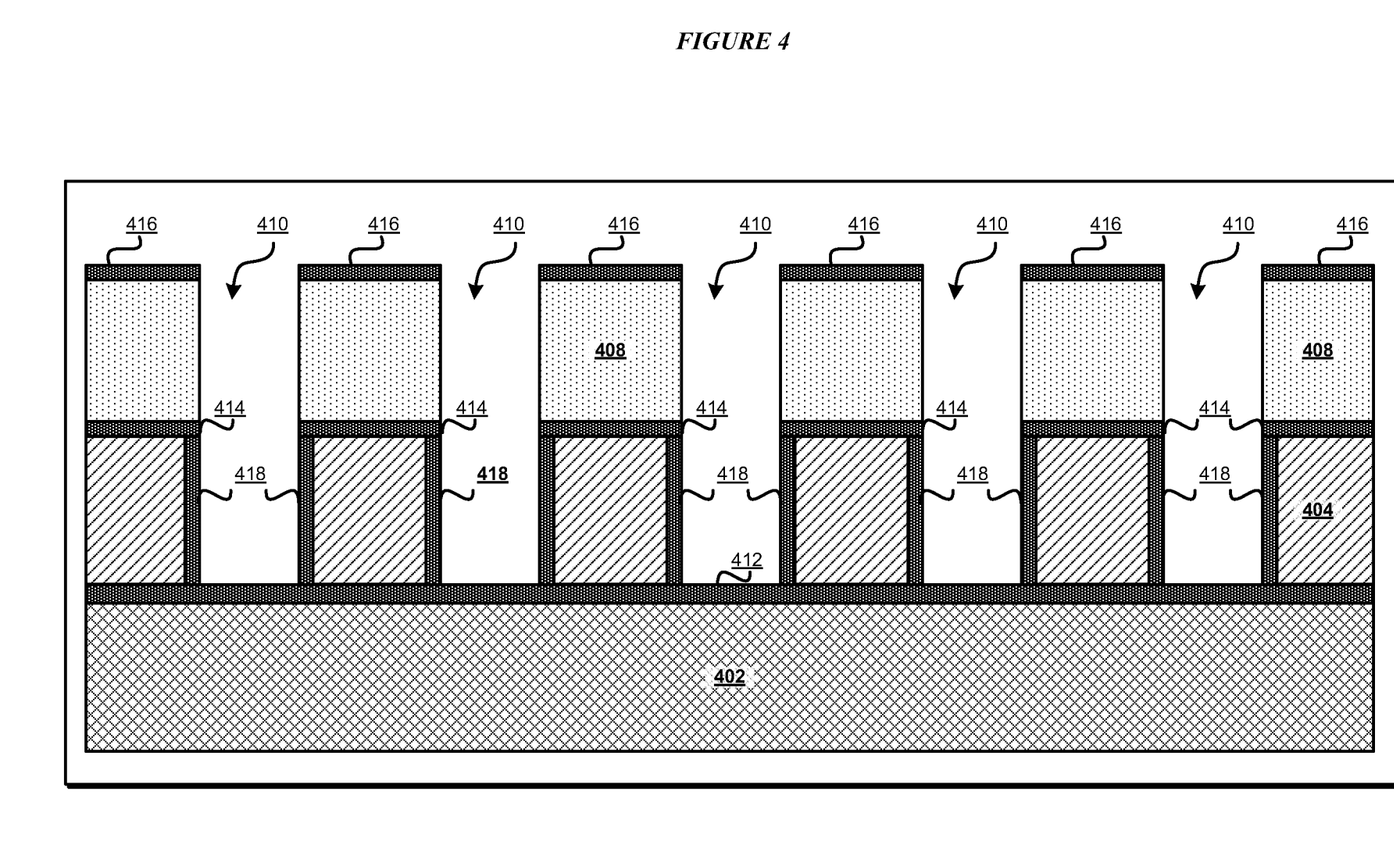
FIG. 4 depicts a cross-sectional view of a transfer mold in accordance with an illustrative embodiment.

With reference to FIG. 4, this figure depicts a cross-sectional view of an example transfer mold, showing optional layers that can be included in accordance with an illustrative embodiment.

For example, an embodiment includes forming pillars 112 using a problematic type of solder or a problematic pillar aspect ratio that prevents solder from properly filling the recesses 410. So at the bottom of the recess the wetting layer is a thin layer of metal that allows the solder to fill the recess and stay at the bottom, and as the solder is setting up In such an embodiment, a wetting layer is employed to correct the problem by forming the wetting layer at layer location 412, and optionally formed at layer locations 418 as well. The wetting layers allow a subsequent conductive material to be reflowed with minimized interaction with surfaces having the wetting layers, i.e., at layer location 412 and/or 418. For example, an embodiment includes a wetting layer that includes one or more of titanium and gold, silver or copper formed at layer locations 412 and 418, and a pillar 112 including aluminum (Al) is then deposited and reflowed to fill the openings 410 and allowed to forming the pillars 112 with minimized interaction between the aluminum (Al) of the pillar 112 and the wetting layers at layer locations 412 and 418. For example, an embodiment includes a wetting layer that includes titanium and one or more of gold, silver, and copper, in which the titanium acts as an adhesion layer between the substrate and the gold, silver, and/or copper acts as a wetting layer such that, during a subsequent reflow (for a period of time) the gold/silver/copper would be consumed by the material of the pillar 112 and then de-wet the titanium, making the pillar 112 more easily separable from the substrate 402.

In an embodiment, a seed layer is formed at layer location 412 to allow the pillars 112 to be formed by known electroplating processes as an alternative to using injection molding as described above in connection with FIG. 1E. In another embodiment, a layer of gold is formed at layer location 412, and solder is injected into recesses 410 to form pillars; the gold is a high energy metal that reacts with the solder to make sure the solder stays in the recesses 410. For example, in one such embodiment, the gold at layer location 412 also acts as a release layer when heated to allow for easier separation, while having helped maintain the solder in the recesses during the various processes stages, which is helpful when transferring pillars 112 having relatively higher aspect ratios.

In an embodiment, one or both of the layer locations 412 and 414 are provided as metal or adhesion layers that help to secure the first photoresist layers 404 to the substrate 402 (at layer location 412) or help to secure the second photoresist layers 408 to the first photoresist layers 404 (at layer locations 414).

In an embodiment, layer locations 416 are provided as non-wetting layers that prevent solder deposits on the second photoresist layer 408. For example, in an embodiment, layers of titanium, molybdenum, or graphite at layer locations 416 act as non-wetting layers because when solder is reflowed and comes in contact with exposed titanium, molybdenum, or graphite, the non-wetting property of these materials causes the solder tends to form loose solder balls rather than metallic bonds.

With reference to FIGS. 5A-5F, these figures show schematic, cross-sectional diagrams showing an exemplary method for forming solder bumps accordance with an illustrative embodiment. For example, in a particular embodiment, a transfer mold 506 is used for forming solder bumps 514 on an organic substrate 502 having a through hole 504. In an embodiment, a qubit device 516 is flip-chip mounted such that the qubit 518 can be tuned by emitting direct heat, electromagnetic (EM) radiation, or reactive chemical species along a path 508 that passes through the through hole 504 in the organic substrate 502.

Figure 5:
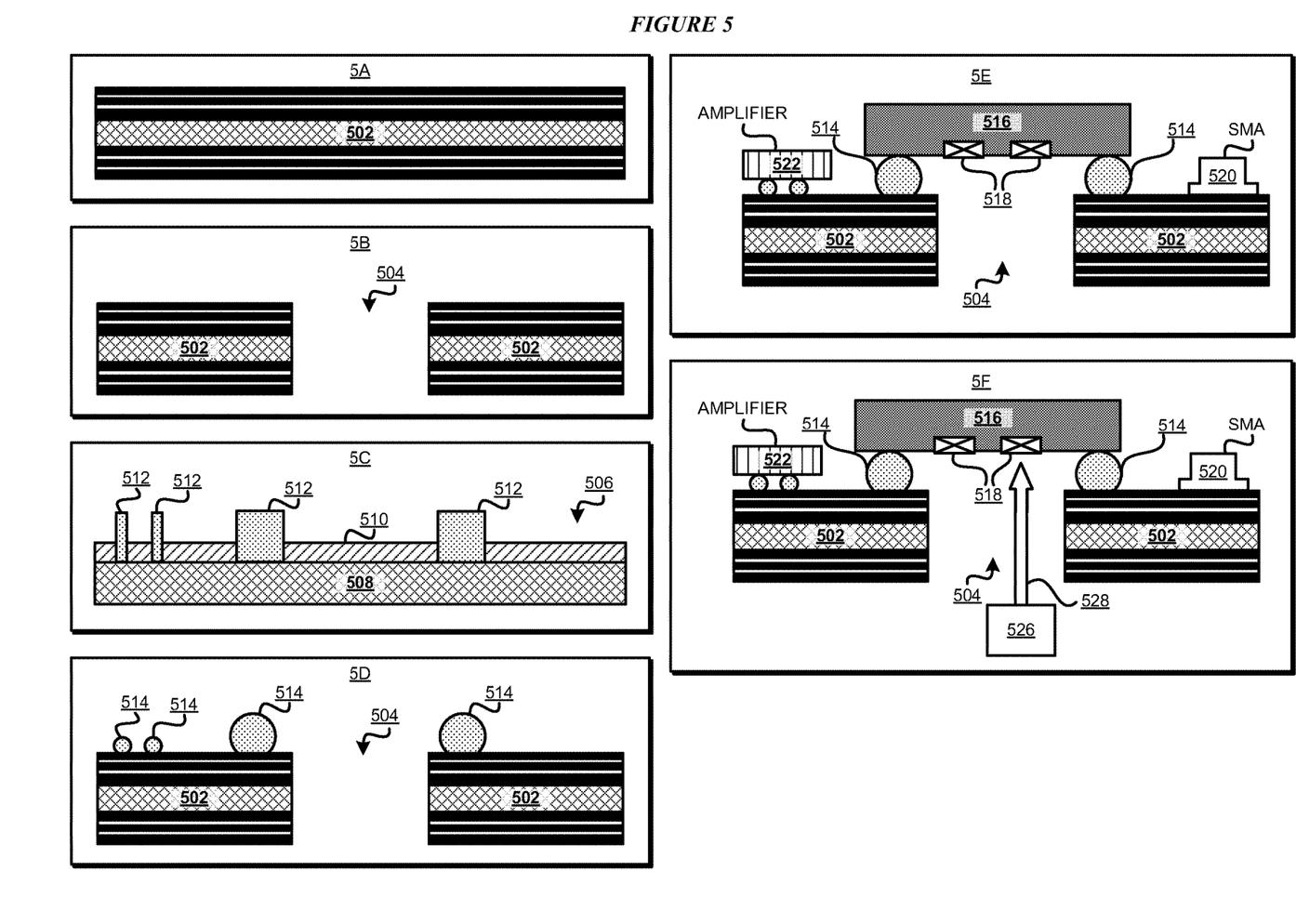
FIG. 5 depicts schematic, cross-sectional diagrams 5A, 5B, 5C, 5D, 5E, and 5F showing an example method for forming solder bumps in accordance with an illustrative embodiment.

With reference to FIGS. 5A and 5B, in a particular embodiment, an organic substrate 502 is provided and a through hole 504 is cut, drilled, or otherwise formed therethrough. In an embodiment, the through hole 504 is formed by etched photolithographic processes or laser drilling. In an alternative embodiment, the organic substrate 502 is preformed with the through hole 504. In an embodiment, the organic substrate 502 includes, as a non-limiting example, laminate materials made of glass fibers in an epoxy and bismaleimide triazine (BT) resin. In an embodiment, the through hole 504 is one of a plurality of through holes in the substrate 502.

As another example, the substrate 502 is a non-rigid or flexible substrate formed of one or more of the following non-limiting example materials: (1) Polyimide film (such as Kapton), (2) polyethylene terephthalate (PET), (3) polyethylene naphthalate (PEN), (4) Polyether ether ketone (PEEK), (5) polyethylene (PE), (6) polyvinyl chloride (PVC), and (7) thin flexible metal or glass. In an embodiment, the substrate 502 is a flexible substrate having a relatively low Young's modulus of elasticity. For example, in an embodiment, the substrate 502 is a flexible substrate having a Young's modulus that is in a range of 60 kPa to 3 MPa.

With reference to FIG. 5C, a transfer mold 506 is fabricated as shown in FIGS. 1A-1F and described above, resulting in the illustrated structure having a substrate 508, a first photoresist layer 510, and a plurality of pillars 512, including a pair of small pillars 512 and a pair of large pillars 512.

In an embodiment, the substrate 508 is a non-rigid or flexible substrate formed of one or more of the following non-limiting example materials: (1) Polyimide film (such as Kapton), (2) polyethylene terephthalate (PET), (3) polyethylene naphthalate (PEN), (4) Polyether ether ketone (PEEK), (5) polyethylene (PE), (6) polyvinyl chloride (PVC), and (7) thin flexible metal or glass. In an embodiment, the substrate 508 is a flexible substrate having a relatively low Young's modulus of elasticity. For example, in an embodiment, the substrate 508 is a flexible substrate having a Young's modulus that is in a range of 60 kPa to 3 MPa.

In an embodiment, the transfer mold 506 is flexible, allowing it to conform to a flat or macroscopically curved substrate for transferring solder thereto. For example, in an embodiment, both the transfer mold 506 and the substrate 508 are flexible and are non-planar while solder is transferred from the transfer mold 506 to the substrate 502. In an embodiment, the substrate 5082 is rigid but macroscopically curved, and the transfer mold 506 is flexible and bends to conform to the shape of the substrate 508 while transferring solder to the substrate 502.

With reference to FIG. 5D, the transfer mold 506 forms the solder bumps 514 on the organic substrate 502 as described above with reference to FIGS. 1H and 1J such that pillars 512 become solder bumps 514. In an embodiment, the organic substrate 502 can include wet-able pads (not shown) formed of copper, gold or nickel to provide contact surfaces for forming metallic bonds with the solder bumps 514.

With reference to FIGS. 5E and 5F, these figures depict cross-sectional views of an example semiconductor package in accordance with an illustrative embodiment. In a particular embodiment, the semiconductor package is a flip-chip package that includes a semiconductor device 516 having a plurality of qubit Josephson junctions 518 disposed face-down on an organic substrate 502.

In an embodiment, the Josephson junctions 518 are aligned with the through hole 504 defined by the organic substrate 502. In an embodiment, the through hole 504 allows a junction modification system 526 to emit direct heat, electromagnetic (EM) radiation, or reactive chemical species along a path 528 to tune each qubit Josephson junction 518.

For example, in an embodiment, the junction modification system 526 modifies the Josephson junction 518 by emitting direct heat, electromagnetic (EM) radiation, or reactive chemical species along a path 508 to the Josephson junction 518 to allow for a physical change to occur within the Josephson junction 518 that results in a change in the resistance.

Figure 6:
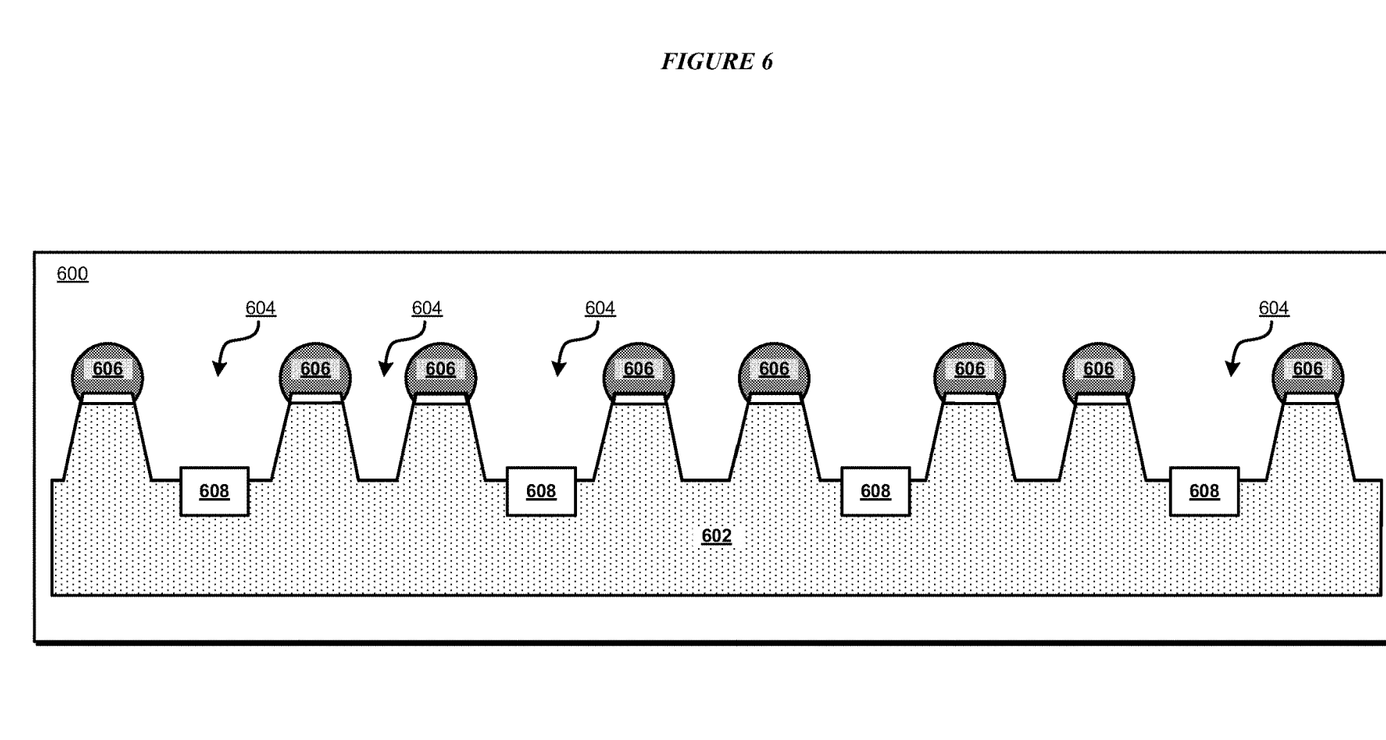
FIG. 6 depicts a schematic, cross-sectional diagram of an interposer in accordance with an illustrative embodiment.

With reference to FIG. 6, this figure depicts an interposer 600 with deep well features 604 between solder bumps 606 that can be formed using a transfer mold in the same manner described above in connection with FIGS. 1A-1J. In a particular embodiment, the interposer 600 includes a substrate 602 with recessed circuit components 608 in the bottom of recesses 604. For example, in an embodiment, the recesses 604 are microwave cavities and the circuit components are qubits having Josephson junctions. In an embodiment, the solder bumps 606 are formed of indium or an indium alloy. In an embodiment, the solder bumps 606 are formed on the substrate 602 using a transfer mold, such as the transfer mold 100 shown in FIG. 1F, with the solder for the solder bumps 606 is transferred from pillars 112 on the transfer mold 100.

Figure 7:
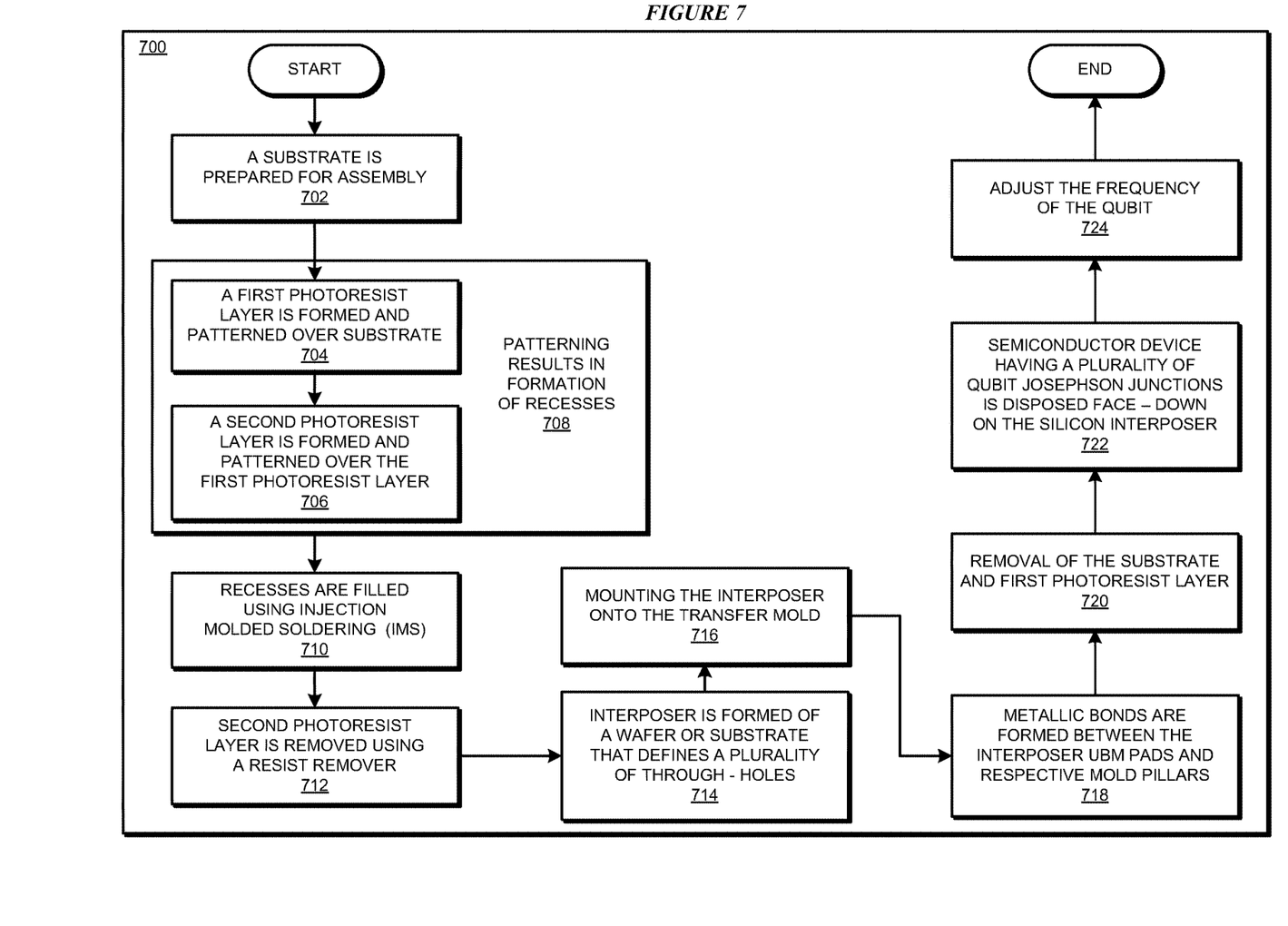
FIG. 7 depicts a flowchart of an example process for forming solder bumps in accordance with an illustrative embodiment.

With reference to FIG. 7, this figure depicts a flowchart of an example process 700 for solder bumps in accordance with an illustrative embodiment. In a particular embodiment, the process 700 includes a process as described above in connection with FIGS. 1A-1J, 2, and 3.

In a particular embodiment, at block 702, a substrate is prepared for assembly. In an embodiment, the preparation of the substrate includes one or more processes for improving the adhesion of the forthcoming photoresist material to the substrate. For example, in an embodiment, the substrate is prepared in such a way that includes at least one of (1) cleaning to remove contamination, (2) dehydration baking to remove moisture, and (3) adding an adhesion promoter to the substrate.

In an embodiment, at block 704, a first photoresist layer is formed and patterned over the substrate using any known photolithography process that is suitable. In an embodiment, the first photoresist layer is composed of one or more sublayers of a "permanent" photoresist material that is relatively difficult to remove. For example, in an embodiment, the first photoresist layer is composed of photo-patternable resist that is stable at molten solder temperatures and stable with respect to strippable solvent, such as a highly crosslinked epoxy. In an embodiment, the first photoresist layer is formed by one or more applications of a coating material, including spin coating each application of coating material to form one or more thin, uniform sublayers that collectively form the second photoresist layer having a specific, predetermined thickness, followed by patterning to selectively remove portions of the photoresist material, thereby forming recesses. In an embodiment, the recesses extend to the substrate.

In an embodiment, at block 706, a second photoresist layer is formed and patterned over the first photoresist layer according to the same patterning used to pattern the first photoresist layer using any known photolithography process that is suitable. In an embodiment, the second photoresist layer is composed of one or more sublayers of a photoresist material that is relatively easy to remove. For example, in an embodiment, the second photoresist layer is composed of a "strippable" photo-patternable resist that is stable at molten solder temperatures but is also easily strippable with solvent.

In an embodiment, the second photoresist layer is formed by one or more applications of a coating material, including spin coating each application of coating material to form one or more thin, uniform sublayers that collectively form the second photoresist layer having a specific, predetermined thickness, followed by patterning to selectively remove portions of the photoresist material, thereby forming recesses.

In an embodiment, at block 708, the patterning at blocks 704 and 706 includes pattern features where the recesses are formed and are arranged such that the recesses formed at block 704 are aligned with the recesses formed at block 706. In an embodiment, the recesses formed at blocks 704 and 706 extend from an upper surface of the second photoresist layer to an upper surface of the substrate. In some embodiments, blocks 706 and 708 can optionally include forming any one or more layers described with reference to FIG. 4 at locations 412, 414, 416, and 418.

In an embodiment, at block 710, the recesses are filled using injection molded soldering (IMS), where a fill head traverses the substrate and injects molten solder into the recesses to form pillars. In an embodiment, the recesses are filled completely to the tops, thereby ensuring uniformity of height of the resulting solder bumps without leaving a solder residue on the mask, and the pillars are allowed to solidify, conforming to the shape of the recesses. It will be appreciated that block 710 can alternatively include using electroplating to form the pillars.

In an embodiment, at block 712, the second photoresist layer is removed using a resist remover for suitable for wafer level packaging (WLP). For example, in an embodiment, the resist remover is an aqueous organic mixture formulated to effectively remove thick photoresist used in wafer bumping and WLP, such as DuPont™ EKC162™ resist remover. Since the first photoresist layer is formed of a photoresist material that is stable with respect to such a resist remove, the first photoresist layer remains while the remaining portions of the second photoresist layer are stripped away leaving the conductive pillars.

In an embodiment, at block 714, an interposer is formed from a wafer or substrate formed of a suitable semiconductor substrate material. In an embodiment, the interposer defines a plurality of through holes selectively positioned to align with qubits on a semiconductor device that will be connected to the interposer in a flip-chip manner. In an embodiment, through holes are formed by etched photolithographic processes or laser drilling.

In an embodiment, at block 716, the interposer is mounted onto the transfer mold by flipping the interposer such that solder contact points on the interposer are facing and aligned with the pillars of the transfer mold.

In an embodiment, at block 718, the interposer is attached to the transfer mold by forming metallic bonds between the interposer UBM pads and respective transfer-mold pillars. In one embodiment, the pillars are attached to respective UBM pads using a reflow process of heating the pillars until they begin to melt while in contact with UBM pads, and then allowing them to cool and re-solidify, resulting in solder joints between the pillars and respective UBM pads. In another embodiment, the metallic bonds between the pillars and UBM pads are formed by cold welding processes that bond certain metals at temperatures below reflow temperature, such as room-temperature diffusion or diffusion at temperatures between room temperature and reflow temperature. For example, in an embodiment, the metallic bonds between the pillars and UBM pads are formed by cold welding processes that include applying pressure at room temperature or with some amount of heat being applied.

In an embodiment, at block 720, the substrate and first photoresist layer are removed from the pillars that are now metallically bonded to the interposer. In a particular embodiment, the substrate and first photoresist layer can be lifted away from the interposer and leave the pillars attached to the interposer because the metallic bond between the solder in the pillars and the UBM pads is much stronger than the secondary types of forces that were holding the pillars to the substrate, such as dispersion or Van Der Waals types of forces.

In an embodiment, at block 722, a semiconductor device having a plurality of qubit Josephson junctions is disposed face-down on the silicon interposer. In an embodiment, the Josephson junctions are aligned with the through-holes defined by the interposer to allow a junction modification system to emit direct heat, electromagnetic (EM) radiation, or reactive chemical species to tune the qubit Josephson junctions on the semiconductor device.

In an embodiment, at block 724, the process adjusts the resistance of the Josephson junction in order to adjust the frequency of the qubit. In an embodiment, a junction modification system adjusts the Josephson junction by applying direct heat, electromagnetic (EM) radiation, or reactive chemical species using a path through the through hole in the interposer.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

Thus, a computer implemented method, system or apparatus, and computer program product are provided in the illustrative embodiments for managing participation in online communities and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A superconducting quantum processor, comprising:
a superconducting chip comprising a qubit; and
an interposer connected to the superconducting chip by a plurality of solder interconnections located between the interposer and superconducting chip, the interposer defining a hole therethrough aligned with the qubit on the superconducting chip,
wherein the plurality of solder interconnections forms a wall around the qubit.

2. The superconducting quantum processor of claim 1, wherein the wall includes at least one gap therethrough.

3. The superconducting quantum processor of claim 2, wherein the at least one gap is at least 10 µm wide.

4. The superconducting quantum processor of claim 1, wherein the plurality of solder interconnections are connected to the superconducting chip and to the interposer by respective metallic bonds.

5. The superconducting quantum processor of claim 1, further comprising:
a device substrate including a wettable pad.

6. The superconducting quantum processor of claim 5, wherein the device substrate comprises an organic substrate.

7. The superconducting quantum processor of claim 5, wherein the device substrate comprises semiconductor substrate, and further comprises a deep recess in the semiconductor substrate.

8. The superconducting quantum processor of claim 7, wherein the semiconductor substrate comprises a circuit component in the deep recess.

9. The superconducting quantum processor of claim 5, wherein a solder interconnection in the plurality of solder interconnections has a shape of a solder pillar, the superconducting quantum processor further comprising:
a metallic bond between the solder pillar and the wettable pad.

10. The superconducting quantum processor of claim 5, further comprising:
a hole through the device substrate.

11. The superconducting quantum processor of claim 1, wherein the qubit comprises a Josephson junction, and wherein the hole through the interposer is aligned with the Josephson junction to provide a path for accessing the Josephson junction.

12. The superconducting quantum processor of claim 11, wherein the wall is configured between the interposer and superconducting chip so as to surround the hole through the interposer.

13. The superconducting quantum processor of claim 11, wherein the wall is configured to operate as a thermal isolator for the Josephson junction.

14. The superconducting quantum processor of claim 1, wherein the plurality of solder interconnections includes a first solder interconnection having a first diameter and a second solder interconnection having a second diameter, the first diameter being larger than the second diameter.

* * * * *